United States Patent [19]

Hidese

[11] Patent Number: 5,184,397
[45] Date of Patent: Feb. 9, 1993

[54] ELECTRICAL COMPONENT PLACING APPARATUS

[75] Inventor: Wataru Hidese, Chikushino, Japan

[73] Assignee: Matsushita Electric Industrial Co., Ltd., Osaka, Japan

[21] Appl. No.: 738,622

[22] Filed: Jul. 31, 1991

[30] Foreign Application Priority Data

Aug. 9, 1990 [JP] Japan .................................. 2-212563

[51] Int. Cl.$^5$ .............................................. H05K 3/30
[52] U.S. Cl. ......................................... 29/740; 29/809
[58] Field of Search ................. 29/740, 739, 741, 809, 29/819, 822

[56] References Cited

U.S. PATENT DOCUMENTS

| | | | |
|---|---|---|---|
| 4,980,971 | 1/1991 | Bartschat | 29/740 X |
| 4,984,354 | 1/1991 | Mohara et al. | 29/740 X |
| 4,985,986 | 1/1991 | Fritsch | 29/740 |
| 4,987,673 | 1/1991 | Kogura | 29/740 X |

Primary Examiner—Timothy V. Eley
Attorney, Agent, or Firm—Pollock, Vande Sande & Priddy

[57] ABSTRACT

An electrical component placing apparatus having a rotary head is required to be further accelerated to place an electrical component. In order to accelerate the operation of the placing apparatus, the indexing speed of the rotary head must be accelerated. However, since the rotary head is heavy, its rotating inertial is large. Thus, when the indexing speed of the rotary head is accelerated, a vibration at the time of stopping indexing of the rotary head is increased as well. Therefore, mistakes of picking up the electrical component by the pick and place head and placing the electrical component on the substrate occur. This invention reduces the outer diameter of a rotor for indexing a pick and place head smaller than the diameter of a guide for guiding the indexing of a pick and place head, disposes a bracket for supporting the pick and place head along the wall surface of the rotor and reduces the rotating diameter of the pick and place head smaller than the diameter of the guide. With the arrangement described above, the rotary head is reduced in size to largely reduce its weight and to reduce the rotary inertia of the rotary head. Therefore, the rotary inertia of the rotary head is reduced, and the vibration of the pick and place head at the time of indexing is reduced. Consequently, the rotary head can be indexed at a high speed, thereby placing the electrical component on the substrate at a high speed.

3 Claims, 2 Drawing Sheets

ELECTRICAL COMPONENT PLACING APPARATUS

BACKGROUND OF THE INVENTION

1. FIELD OF THE INVENTION

This invention relates to an electrical component placing apparatus and, more particularly, to means for accelerating a mounting speed by reducing a vibration at the time of stopping indexing due to the rotary inertial of a rotary head.

2. DESCRIPTION OF THE PRIOR ART

An electrical component placing apparatus having a rotary head widely prevails as a high speed placing apparatus for placing an electrical component such as an LSI, an IC, a chip capacitor, a chip resistor, etc., on a substrate.

The electrical component placing apparatus having the rotary head is adapted to pick up an electrical component of an electrical component supplying apparatus by a pick and place head and to feed and place the electrical component on a substrate positioned on an XY table by indexing the rotary head.

Recently, the electrical component placing apparatus having the rotary head is required to be further accelerated to place an electrical component. In order to accelerate the operation of the placing apparatus, the indexing speed of the rotary head must be accelerated. However, since the rotary head is heavy, its rotating inertial is large. Thus, when the indexing speed of the rotary head is accelerated, a vibration at the time of stopping indexing of the rotary head is increased as well. Therefore, mistakes of picking up the electrical component by the pick and place head and placing the electrical component on the substrate occur.

In order to prevent such mistakes as described above, the electrical component is picked up and placed after the vibration is completely stopped. Then, the waiting time becomes a loss time to increase its cycle time and to hence disable acceleration of placing the electrical component.

SUMMARY OF THE INVENTION

Accordingly, an object of this invention is to provide an electrical component placing apparatus for placing an electrical component on a substrate at a much faster speed by reducing the outer diameter of a rotor for indexing a pick and place head smaller than the diameter of a guide for guiding the indexing of a pick and place head, disposing a bracket for supporting the pick and place head along the wall surface of the rotor and reducing the rotating diameter of the pick and place head smaller than the diameter of the guide.

According to the arrangement described above, the rotary head is reduced in size to largely reduce its weight and to reduce the rotary inertia of the rotary head. Therefore, the rotary inertia of the rotary head is reduced, and the vibration of the pick and place head at the time of indexing is reduced. Consequently, the rotary head can be indexed at a high speed, thereby placing the electrical component on the substrate at a high speed.

These and other objects and features of the present invention will become apparent from the following detailed description in conjunction with the attached drawings.

DESCRIPTION OF THE PREFERRED EMBODIMENT

An embodiment of an electrical component placing apparatus according to the present invention will now be described with reference to the accompanying drawings.

Figure 1:
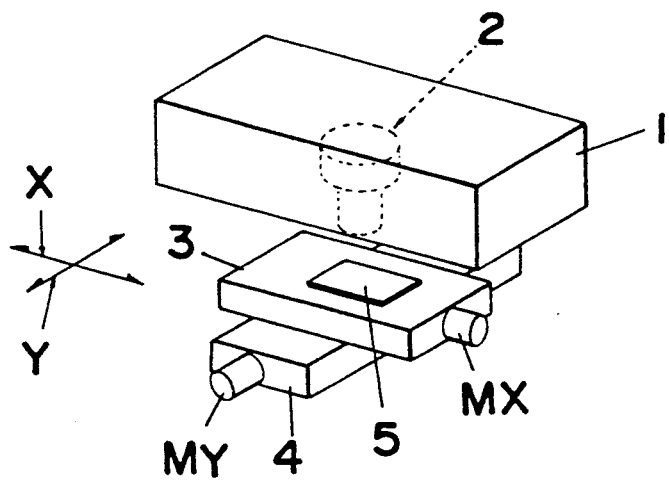
FIG. 1 is a perspective view of an electrical component placing apparatus according to an embodiment of the present invention.
Figure 2:
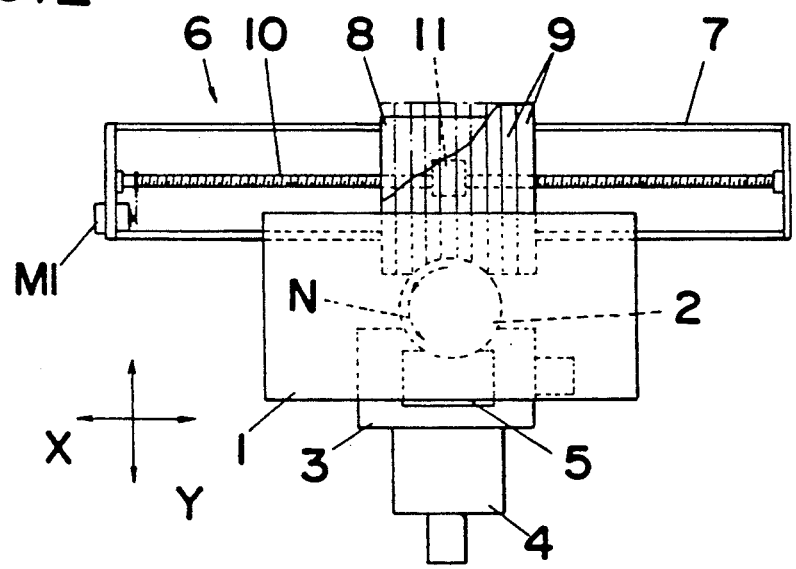
FIG. 2 is a plan view of the electrical component placing apparatus of the embodiment.

FIG. 1 is a perspective view of an electrical component placing apparatus of the embodiment of the invention, and FIG. 2 is a plan view of this embodiment. This electrical component placing apparatus comprises a body box 1. A driver such as a motor, gears, etc., is contained in the body box 1. A rotary head 2 is provided in the lower portion of the body box 1. The rotary head 2 is driven by the driver in the body box 1 to be indexed in a direction of an arrow N (FIG. 2).

XY tables 3 and 4 are provided in front of the body box 1, and driven by drive motors MX and MY. A substrate 5 is positioned at the XY tables 3 and 4. When the motors MX and MY are driven, the substrate 5 is moved in directions X and Y.

An electrical component supplying device 6 is provided at the rear of the body box 1. A supplying base 7 is provided, and a plate 8 is placed thereon. A number of parts feeders 9, such as taper feeders, tube feeders are placed on the plate 8. A feed threaded rod 10 driven by a motor M1 is provided in the supplying base 7. A nut 11 to be engaged with the feed threaded rod 10 is provided on the lower surface of the plate 8. Therefore, when the motor M1 is driven, the plate 8 is moved in the direction X to move the parts feeder 9 having a predetermined electrical component to a pick and place position (to be described later). When the rotary head 2 is indexed, the pick and place head picks up the electrical component of the parts feeder 9, and feeds and places it on the substrate 5.

The detailed structure of the rotary head 2 will be described by referring to FIG. 3.

A guide 20 is provided in the lower portion of the body box 1, and a guide groove 21 is formed on the outer periphery of the guide 20. A bearing 22 is provided in the lower portion of the guide 20, and a first rotor 23 is mounted at the bearing 22. A second rotor 24 is mounted at the lower portion of the first rotor 23. The rotors 23 and 24 are driven by a driver contained in the body box 1 to be indexed in the direction of the arrow N. The rotor 23 may be rotated integrally with the rotor 24. In order to reduce the weight of the rotor 24 to decrease its rotary inertia, the rotor 24 is formed in a hollow drum shape having a hollow portion 24a.

Pick and place heads 25 are provided under the guide 20. A plurality of nozzles 27 and 28 for sucking electrical components C are provided in cases 26 of the pick and place heads 25. The nozzles 27, 28 are selectively used according to the type of the electrical component C.

A first bracket 29 is provided to support the pick and place heads 25. A second bracket 30 is coupled to the upper portion of the bracket 29. Rollers 31 and 32 are journaled to the upper end of the bracket 30. One roller 31 is engaged with the guide groove 21. The other roller 32 is brought into contact with the lower surface of the guide 20. Bearings 33 and 34 are journaled coaxially with the rollers 31 and 32. Pawls 35 and 36 are engaged between the bearings 33 and 34. The pawls 35 and 36 are driven by the driver provided in the body box 1 to vertically move upward or downward.

Cutouts 37 and 38 are partly formed at the lower portion of the guide groove 21. A vertical guide rail 41 is mounted on the bracket 29. A slider 42 engaged with the guide rail 41 is mounted on the wall surface of the rotor 24. When the one pawl 35 moves upward, the pick and place head 25 rises, and sucks to pick up the electrical component C of the parts feeder 9 to the nozzles 27 and 28. When the other pawl 36 moves upward, the pick and place head 25 rises, and places the electrical component C on the substrate 5. The pick and place head 25 places the electrical component C on the substrate 5 at the lower position 21a of the guide groove 21. The pick and place head 25 picks up the electrical component C at the higher position 21b of the guide groove 21. With the arrangement thus constructed, an interval L between the nozzle 27 and the substrate 5 at the time of picking up the electrical component C is sufficiently increased to establish a space in which the substrate 5 can enter under the base 12 of the parts feeder 9 and to further establish an arranging space S of a cutter 45 (to be described later). A motor M2 is provided on the bracket 29. When the motor M2 is driven, the pick and place head 25 is horizontally rotated in a direction $\theta$.

The outer diameters D2 and D3 of the rotors 23 and 24 are smaller than the diameter D1 of the guide 20. The brackets 29 and 30 are disposed along the wall surfaces of the rotors 23 and 24. Thus, the guide 20, the rotors 23, 24 and the brackets 29, 30 are arranged to reduce in size and weight the rotary head 2 and to also reduce the rotating diameter D4 of the pick and place head 25.

When the gradient $\alpha$ of the guide groove 21 is abrupt, the acceleration of rising and falling motions of the pick and place head 25 is increased. When the acceleration is increased, the electrical components C tend to be dropped from the nozzles 27, 28. Therefore, the gradient $\alpha$ of the guide groove 21 must be smooth to slowly rise and fall the pick and place head 25. To this end, the diameter D1 of the guide 20 must be increased.

When the rotating diameter D4 of the pick and place head 25 is increased, its rotary inertia is increased. When the rotary inertia is increased, the vibration of the pick and place head 25 at the time of stopping indexing is increased. When the pick and place head 25 is vibrated, mistakes of picking up and placing the electrical component C occur. Therefore, the pick and place head must pick up and place the electrical component C after the vibration is completely stopped. However, the time for waiting the stop of the vibration becomes a loss time, and the mounting speed of the pick and place head is delayed as well.

However, the electrical component placing apparatus of the present invention disposes the brackets 29 and 30 along the small-sized rotors 23 and 24. Therefore, since the rotating diameter D4 of the pick and place head 25 is small and the rotary head 2 is light in weight, when the indexing of the rotary head 2 is stopped, the vibration of the pick and place head 25 is immediately stopped.

Figure 4:
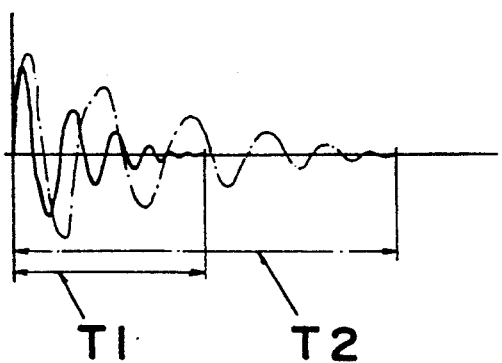
FIG. 4 is a diagram of the vibration of the placing apparatus.

In FIG. 4, T1 is the vibrating time of the electrical component placing apparatus according to the present invention, and T2 is the vibrating time of the conventional electrical component placing apparatus. Thus, the picking operation and the placing operation of the placing apparatus can be accelerated by reducing the vibrating time T1 at the time of stopping indexing to accelerate the mounting speed of the pick and place head of the placing apparatus.

Figure 3:
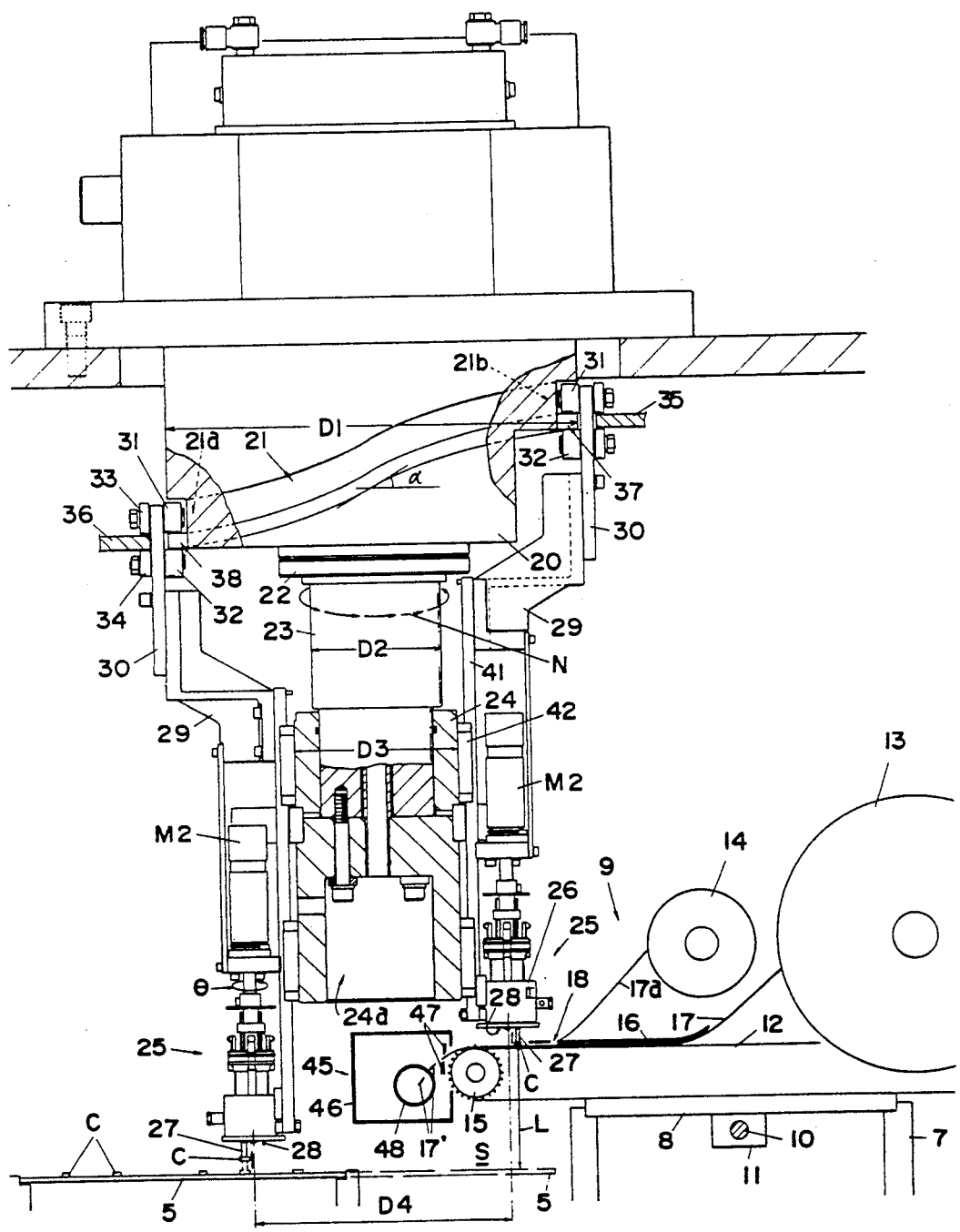
FIG. 3 is a side view of a rotary head of this embodiment.

In FIG. 3, the base 12 of the parts feeder 9 is provided. A supply reel 13, a takeup reel 14, a sprocket 15 and a cover plate 16 are provided in the base 12. A tape 17 in which the electrical component C is sealed is wound on the supply reel 13. When the sprocket 15 is pitch-rotated, the tape 17 is pitch-fed forward. A cover tape 17a is peeled by a slit 18 formed at the cover plate 16, and taken up by the takeup reel 14.

The cutter 45 is arranged under the rotor 24. The cutter 45 comprises a box 46, a cutting edge 47 arranged in the box 56 and a suction tube 48. The vacant tape 17 in which the electrical component C is picked up is introduced into the box 46, and cut by the cutting edge 47. The cut fine pieces 17, of the tape are sucked into the tube 48. The substrate 5 is driven by the XY table 4, and introduced into the position under the cutter 45 and the parts feeder 9. Thus, the cutter 45 is provided under the rotor 24 to establish a sufficient arranging space S of the substrate 5 under the cutter 45.

According to the present invention as described above, the present invention reduces the outer diameter of the rotor for indexing the pick and place head smaller than the diameter of the guide for guiding indexing of the pick and place head, disposes the bracket for supporting the pick and place head along the wall surface of the rotor and reduces the rotating diameter of the pick and place head smaller than the diameter of the guide. Therefore, the rotary inertial of the rotary head is reduced to reduce the vibration of the pick and place head at the time of stopping indexing to thereby place the electrical component on the substrate at a high speed.

What is claimed is:

1. An apparatus for handling electronic component assembly on a substrate, comprising:
   a substrate support bed movable in dual orthogonal directions;
   means for feeding electronic components to a pick up point;
   a fixed cylindrical guide having a curved peripheral groove formed therein;
   a rotary head assembly having
      a first rotary section coaxially mounted in free rotational relationship to a transverse surface of the guide;
      a second rotary section coaxially mounted to a free transverse end of the first rotary section;
      a bracket extending in parallel relationship to the second rotary section and longitudinally, slidingly connected therewith;
      roller means connected to the bracket and received in the groove for facilitating rotation of the bracket about an axis of the rotary sections;
   means mounted to the bracket for picking up a component at the pick up point;
   means for rotating the rotary head assembly and the pick up means mounted thereto between a component pick up position and an assembly position on the substrate, the positions being axially and angularly displaced relative to one another;

means mounted on the bracket and connected to the pick up means for securing the component to the pick up means at the pick up point and discharging the component on the substrate at the assembly point;

means connected to the support bed for moving the substrate to preselected sequential assembly positions;

the diameter of the first and second rotary sections being less than that of the stationary cylindrical guide; and the diameter of a projected arc of rotation between the pick up and assembly points being less than the diameter of the cylindrical guide.

2. The apparatus set forth in claim 1 together with a tape mounting the components;

means for incrementally displacing one end portion of the tape to the pick up point; and means for cutting the tape, located downstream of the pick up point and below the rotary head.

3. The apparatus set forth in claim 2 wherein the cutting means comprises a cutting edge for cutting said tape, and a vacuum conduit for pneumatically displacing pieces of the tape cut by the cutting means.

* * * * *